US008828252B2

(12) United States Patent
Bradford et al.

(10) Patent No.: US 8,828,252 B2
(45) Date of Patent: Sep. 9, 2014

(54) METHOD AND MATERIALS FOR REVERSE PATTERNING

(75) Inventors: Michael L. Bradford, Midland, MI (US); Eric Scott Moyer, Midland, MI (US); Kasumi Takeuchi, Midland, MI (US); Sheng Wang, Midland, MI (US); Craig Rollin Yeakle, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 54 days.

(21) Appl. No.: 13/386,514

(22) PCT Filed: Jun. 22, 2010

(86) PCT No.: PCT/US2010/039415
§ 371 (c)(1),
(2), (4) Date: Jan. 23, 2012

(87) PCT Pub. No.: WO2011/011142
PCT Pub. Date: Jan. 27, 2011

(65) Prior Publication Data
US 2012/0123135 A1    May 17, 2012

Related U.S. Application Data

(60) Provisional application No. 61/227,919, filed on Jul. 23, 2009, provisional application No. 61/250,092, filed on Oct. 9, 2009.

(51) Int. Cl.
*B44C 1/22* (2006.01)
*H01L 21/02* (2006.01)
*C08G 77/18* (2006.01)
*C08L 83/04* (2006.01)
*H01L 21/033* (2006.01)
*C09D 183/04* (2006.01)

(52) U.S. Cl.
CPC .......... *C08G 77/18* (2013.01); *H01L 21/02137* (2013.01); *C08L 83/04* (2013.01); *H01L 21/0337* (2013.01); *H01L 21/02282* (2013.01); *C09D 183/04* (2013.01)
USPC .................. 216/41; 216/47; 216/58; 216/67; 430/315; 430/324; 549/214

(58) Field of Classification Search
USPC .................. 216/41, 47, 58, 67; 430/315, 324; 549/214
See application file for complete search history.

(56) References Cited

U.S. PATENT DOCUMENTS 6,383,952 B1 * 5/2002 Subramanian et al. ....... 438/781
7,265,234 B2   9/2007 Hamada et al.
(Continued)

FOREIGN PATENT DOCUMENTS

JP   2005-221714     8/2005
JP   2006-117846  *  5/2006
(Continued)

*Primary Examiner* — Shamim Ahmed
(74) *Attorney, Agent, or Firm* — Sharon K. Brady

(57) ABSTRACT

A silsesquioxane resin is applied on top of the patterned photo-resist and cured to produce a cured silsesquioxane resin on top of the pattern surface. Subsequently, an aqueous base stripper or a reactive ion etch recipe containing $CF_4$ is used to "etch back" the silicon resin to the top of the photo-resist material, exposing the entire top surface of the photo-resist. Then, a second reactive ion etch recipe containing $O_2$ to etch away the photoresist. The result is a silicon resin film with via holes with the size and shape of the post that were patterned into the photoresist. Optionally, the new pattern can be transferred into the underlying layer(s).

14 Claims, 1 Drawing Sheet

(56) References Cited

U.S. PATENT DOCUMENTS

| | | | |
|---|---|---|---|
| 8,282,847 B2 * | 10/2012 | Romano et al. | 216/47 |
| 8,304,161 B2 * | 11/2012 | Bradford et al. | 430/270.1 |
| 2005/0224452 A1 * | 10/2005 | Spiess et al. | 216/41 |
| 2007/0212886 A1 * | 9/2007 | Uh et al. | 438/706 |
| 2008/0008954 A1 * | 1/2008 | Abdallah et al. | 430/270.1 |
| 2008/0071017 A1 | 3/2008 | Gordon et al. | |
| 2008/0199805 A1 | 8/2008 | Rushkin et al. | |
| 2008/0311514 A1 | 12/2008 | Nakashima et al. | |
| 2009/0087959 A1 * | 4/2009 | Ban | 438/401 |
| 2009/0280438 A1 * | 11/2009 | Kohno et al. | 430/323 |
| 2010/0040838 A1 * | 2/2010 | Abdallah et al. | 428/195.1 |
| 2011/0236835 A1 | 9/2011 | Fu et al. | |
| 2012/0252920 A1 * | 10/2012 | MacMillan et al. | 522/79 |

FOREIGN PATENT DOCUMENTS

| | | | |
|---|---|---|---|
| JP | 2006307180 | | 11/2006 |
| JP | 2007302635 | | 11/2007 |
| WO | WO 2005-063890 | * | 7/2005 |
| WO | WO 2008/038602 | * | 4/2008 |
| WO | WO 2009068754 | * | 6/2009 |

* cited by examiner

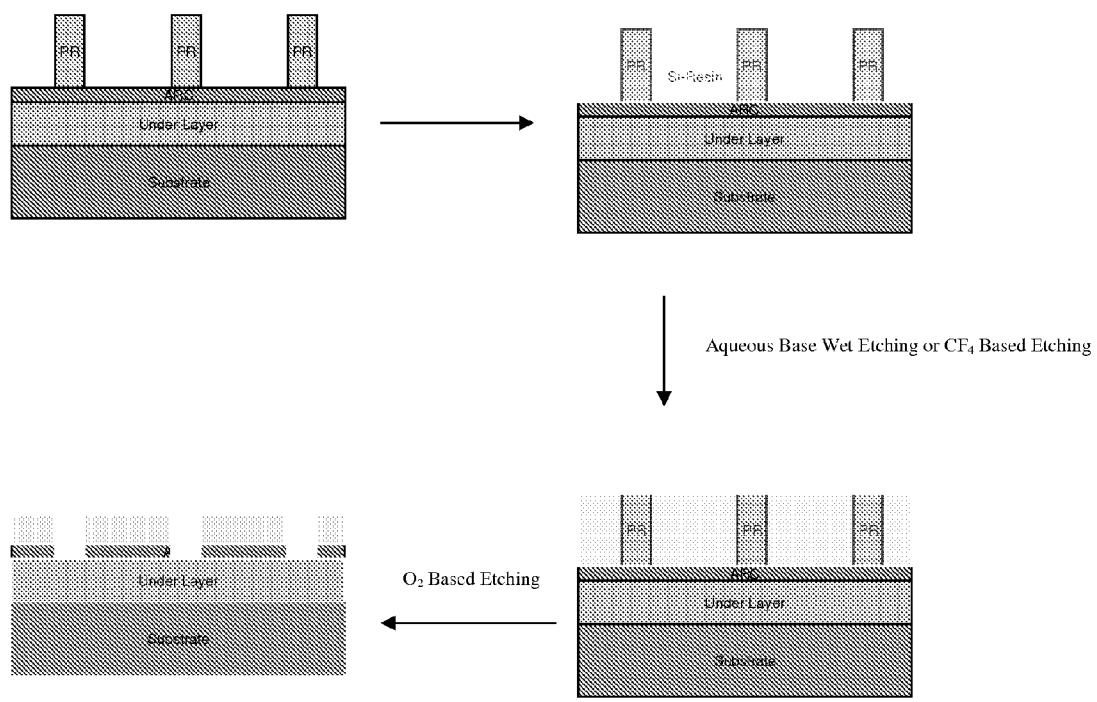

METHOD AND MATERIALS FOR REVERSE PATTERNING

CROSS-REFERENCE TO RELATED APPLICATIONS

This application is a U.S. national stage filing under 35 U.S.C. 0371 of PCT Application No. PCT/US10/39415 filed on Jun. 22, 2010, currently pending, which claims the benefit of U.S. Provisional Patent Application No. 61/227919 filed Jul. 23, 2009 and U.S. Provisional Patent Application No. 61/250092 filed Oct. 09, 2009 under 35 U.S.C. §119(e). PCT Application No. PCT/US10/39415 and U.S. Provisional Patent Application No. 61/227919 and U.S. Provisional Patent Application No. 61/250092 are hereby incorporated by reference.

BACKGROUND OF THE INVENTION

In the microelectronics industry, the requirements for increased circuitry for a given chip size has driven to smaller half-pitch nodes in order to increase the process speed and improve the chip efficiency. Microlithography techniques are key to reducing the size of structural features. The depth of focus and resolution depend on the numerical aperture of the lithography apparatus and the wavelength of light.

As feature sizes continue to decrease in size, it is particularly difficult to pattern round via holes or contact holes into photoresists. As features get smaller and approach 50 nm and beyond in diameter this task becomes extremely difficult to achieve a smooth round shaped via hole of the appropriate dimension in relatively thick film of photoresist. Therefore, alternative approaches to forming via or contact holes in a more etch resistant film are desired.

In this invention a "reverse" patterning technique is employed. The reverse pattern technique involves using a photoresist to pattern posts into the photoresist instead of via holes. After the appropriate dimension of the post is patterned using a photoresist, a silicon containing material is coated on top of the patterned post to cover the entire pattern. For application, this silicon resin is carried in a solvent that the photoresist is not soluble in. After coating, the silicon containing film will be subjected to a low temperature prebake to drive off solvent and slightly crosslink the resin. In some cases further cure is required and can be performed with some activator under thermal or UV treatment. In a "reverse" patterning typical process, in order to transfer the reverse pattern of the photoresist into the silicon containing resin, two dry etching techniques are employed. The first etch step is to use a reactive ion etch recipe containing $CF_4$ to "etch back" the silicon resin to the top of the photoresist material, exposing the entire top surface of the photoresist. The second etch step is to use a second reactive ion etch recipe containing $O_2$ to etch away the photoresist. An alternative "reverse" patterning approach is to use a base soluble silicon material as will be described herein. In this alternative approach, the first etch step is to use tetramethylammonium hydroxide (TMAH) or other aqueous base solution to "etch back" the silicon resin to the top of the photoresist material, exposing the entire top surface of the photoresist. The rest of the steps can be the same or slightly modified typical process. The result is a silicon resin film with via holes with the size and shape of the post that were patterned into the photoresist. The resulting film can be used to further transfer the via hole pattern onto another critical layer. Compared with the typical "reverse" patterning process, the alternative "reverse" patterning process is much easier to pattern post in a photoresist than via holes, this process provides a way to pattern a more etch resistant silicon containing resin than alternative approaches.

In order for a silicon containing material to be useful in alternative reverse patterning, it must meet several criteria. First, it must be carried in a solvent such as an organic alcohol or ether that the photo-resist is not soluble in. Secondly, it must be capable of being cured by multiple cure methods to allow for the formation of select compositions that can be etched by different etch methods such as aqueous bases, $CF_4$ and $O_2$. Additionally, the cured resin composition must be soluble in TMAH to wet "etch back" the silicon resin to the top of the photoresist material, exposing the entire top surface of the photoresist during the process. It has been found that certain silsesquioxane resins meet these criteria.

BRIEF SUMMARY OF THE INVENTION

This invention pertains to the use of silsesquioxane resin compositions in producing patterns on a substrate, typically an electronic device. In this process one starts with a substrate having a patterned photo-resist layer thereon. The silsesquioxane resin is applied over the patterned photo-resist and cured at the pattern surface to produce a cured silsesquioxane resin on the pattern surface. After coating, the silicon containing film will be subjected to a low temperature prebake to drive off solvent. In order to transfer the reverse pattern of the photoresist into the silicon containing resin, two dry etching techniques are employed. The first etch step is to use an aqueous base solution to wet "etch back" the silicon resin to the top of the photoresist material, exposing the entire top surface of the photoresist. The second step is to use a second reactive ion etch recipe containing $O_2$ to etch away the photoresist leaving the silsesquioxane resin. The result is a silicon resin film with via holes the size and shape of the post that were patterned into the photoresist. The resulting film can be used to further transfer the via hole pattern onto another critical layer.

BRIEF DESCRIPTION OF THE DRAWINGS

FIG. 1 represents the process steps of forming a pattern on a substrate using a base soluble silsesquioxane resin using a method of reverse patterning.

DETAILED DESCRIPTION OF THE INVENTION

Disclosed herein is a silsesquioxane resin comprised of the units $(MeSiO_{(3-x)/2}(OR')_x)_m$ $(RSiO_{(3-x)/2}(OR')_x)_n$ $(R^1SiO_{(3-x)/2}(OR')_x)_o$ $(SiO_{(4-x)/2}(OR')_x)_p$ $(Ph(CH_2)_sSiO_{(3-x)/2}(OR')_x)_q$ where Ph is a phenyl group, Me is a methyl group; R' is hydrogen atom or a hydrocarbon group having from 1 to 4 carbon atoms; R is an anhydride containing group such as a 3-succinic anhydride propyl group, and $R^1$ is a hydrophilic group or a hydrophobic group; and s has a value of 0, 1, 2, 3, or 4; x has a value of 0, 1 or 2; wherein in the resin m has a value of 0.1 to 0.95, n has a value of 0.020 to 0.5; o has a value of 0 to 0.5; p has a value of 0 to 0.95; q has a value of 0 to 0.5 and m+n+o+p+q=1. Typically m has a value of 0.1 to 0.95, alternatively 0.2 to 0.85. Typically n has a value of 0.020 to 0.5, alternatively 0.025 to 0.2. Typically o has a value of 0 to 0.5, alternatively 0 to 0.15. Typically p has a value of 0 to 0.95, alternatively 0 to 0.75. Typically q has a value of 0 to 0.5, alternatively 0 to 0.20.

R' is independently a hydrogen atom or hydrocarbon group having 1 to 4 carbon atoms. R' may be exemplified by H, methyl, ethyl, propyl, iso-propyl, n-butyl, and tert-butyl. Typically R' is H or methyl.

In the above formula m+n+o+p+q=1, however one skilled in the art would recognize equals (=) means approximately equal to (≈) because silsesquioxane resin may also contain a small amount (i.e. less than 10%) of silicon atoms, which have either 0, 1 or 2 oxygen atoms attached thereto (the remaining atoms being Me, Ph, R, or $R^1$) or a small number of SiC bonds due to the various factors involved in their formation and/or handling.

R is an anhydride containing group. Examples on anhydride containing groups include 3-succinic anhydride propyl,

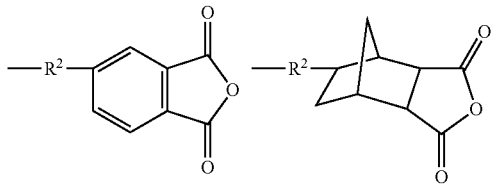

and others, wherein $R^2$ is selected from any aliphatic linkages with 0-4 carbon atoms.

$R^1$ is a hydrophilic group or a hydrophobic group and is selected to tailor the hydrophlicity/hydrophobicity of the resin. Hydrophilic groups may be exemplified by, but not limited to, substituted phenyl groups, ester groups, polyether groups, and mercapto groups. Substituted phenyl groups contain at least one HO—, MeO—, Me-, Et-, Cl—, and/or other substituents. Ester groups may be any organic substituent containing at least one ester functionality. Examples of ester groups useful herein are —$(CH_2)_2$—O—C(O)Me and —$(CH_2)_2$—C(O)—OMe. Polyether groups are an organic substituent having hydrocarbon units linked through oxygen atom, represented, but not limited, by the following structure: —$(CH_2)_a[O(CH_2CH_2)_b]_cOR'$, or —$(CH_2)_a[O(CH_2CH(CH_3))_b]_cOR'$, wherein a=2 to 12; b=1 to 6; c=2 to 200; R'=H, —C(O)CH_3, alkyl, or other organic groups. Examples of polyether groups useful herein are —$(CH_2)_3$—$(OCH_2CH_2)_c$—OMe, —$(CH_2)_3$—$(OCH_2CH_2)_c$—OH and —$(CH_2)_3$—$(OCH_2CH_2)_7$—OAc and —$(CH_2)_3$—$(OCH_2CH_2)_c$—OC(O)Me, and —$(CH_2)_3[O(CH_2CH(CH_3))]_cOH$, —$(CH_2)_3[O(CH_2CH(CH_3))]_cOCH_3$. Mercapto groups have the general formula $HS(CH_2)_r$— where s is as described above. Examples of mercapto groups are mercaptopropyl, mercaptoethyl, and mercaptomethyl.

Hydrophobic groups may be exemplified by, but not limited to, aliphatic groups containing 1-10 carbons, cycloaliphatic groups, fluorine containing aliphatic groups, fluorine containing cycloaliphatic groups. Examples of aliphatic groups useful herein are, propyl, isopropyl, butyl, isobutyl. Examples of cycloaliphatic groups herein are, cyclopentyl, cyclohexyl, substituted cyclopentyl, substituted cyclohexyl. Example of fluorine containing alkyl groups useful herein is 3,3,3-trifluoropropyl.

Examples of resins useful herein may be exemplified by, but not limited to:

$(MeSiO_{(3-x)/2}(OR')_x)_{0.80}(RSiO_{(3-x)/2}(OR')_x)_{0.20}$,

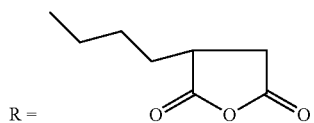

and/or its derivative with an open structure
$MeSiO_{(3-x)/2}(OR')_x)_{0.45}(RSiO_{(3-x)/2}(OR')_x)_{0.05}(SiO_{(4-x)/2}(OR')_x)_{0.50}$

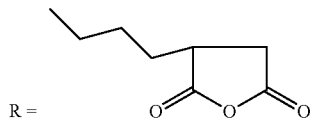

and/or its derivative with an open structure
$MeSiO_{(3-x)/2}(OR')_x)_{0.20}(RSiO_{(3-x)/2}(OR')_x)_{0.05}(SiO_{(4-x)/2}(OR')_x)_{0.75}$

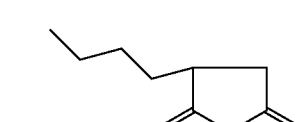

and/or its derivative with an open structure
$MeSiO_{(3-x)/2}(OR')_x)_{0.80}(RSiO_{(3-x)/2}(OR')_x)_{0.05}(PhSiO_{(3-x)/2}(OR')_x)_{0.15})$

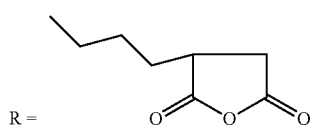

and/or its derivative with an open structure
wherein in the above resins R' is Me or H.

One method for producing the silsesquioxane resin involves the hydrolysis and/or condensation of the appropriate silanes. By this method it is possible that residual —OH and/or —OR' will remain in the silsesquioxane resin as a result of incomplete hydrolysis or condensation. If the total amount of units in the silsesquioxane resin containing —OR' groups, exceed 70 mole % then gellation and instability of the resin may occur. Typically the silsesquioxane resin contains 6 to 60 mole % of units containing —OR' groups, depending upon the synthetic routes.

The silsesquioxane resin has a weight average molecular weight (Mw) in the range of 500 to 200,000, alternatively in the range of 500 to 100,000, alternatively in the range of 700 to 30,0000 as determined by gel permeation chromatography employing RI detection and polystyrene standards.

The silsesquioxane resin is typically produced in the presence of a solvent. Any suitable organic or silicone solvent that does not contain a functional group other than alcohol which may participate in the hydrolysis and/ or condensation reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propionate; alcohols such as methanol, ethanol, and isopropanol. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with 15° C. to 110° C. suggested.

The time to form the silsesquioxane resin is dependent upon a number of factors such as the temperature, the type and amount of silane reactants, and the amount of catalyst. Typically the reaction time is from several minutes to several hours. One skilled in the art will be able to readily determine the time necessary to complete the reaction. Acid catalysts that may be used to facilitate the reaction include, but are not limited to, nitric acid, sulfuric acid, sulfonic acid, hydrochloric acid, acetic acid, and others. Base catalysts that may be used to facilitate the reaction include, but are not limited to, sodium hydroxide, potassium hydroxide, cesium hydroxide, tetramethylammonium hydroxide, tetrabutylammonium hydroxide, triethylamine, among others.

Following completion of the reaction the catalyst may be optionally removed. Methods for removing the catalyst are well known in the art and would include neutralization, stripping or water washing or combinations thereof. Large amounts of catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form or desired concentration. For example, the silsesquioxane resin may be concentrated by removing the solvent. The method of solvent removal is not critical and numerous methods are well known in the art (e.g. distillation under heat and/or vacuum). Once the concentration of the silsesquioxane resin reaches to a certain concentration, the resin can be diluted with the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

Also disclosed herein is a method for forming a pattern on a substrate wherein the method comprises (I) applying a coating composition over a first patterned material wherein the coating composition comprises
(i) a silsesquioxane resin comprised of the units

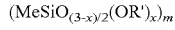

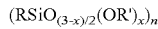

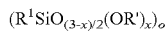

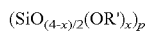

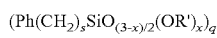

where Ph is a phenyl group, Me is a methyl group; R' is hydrogen atom or a hydrocarbon group having from 1 to 4 carbon atoms; R is an anhydride containing group such as a 3-succinic anhydride propyl group, and $R^1$ is a hydrophilic group or a hydrophobic group; and s has a value of 0, 1, 2, 3, or 4; x has a value of 0, 1 or 2; wherein in the resin m has a value of 0.1 to 0.95, n has a value of 0.020 to 0.5; o has a value of 0 to 0.5; p has a value of 0 to 0.95; q has a value of 0 to 0.5 and m+n+o+p+q=1;

(ii) a solvent for carrying the resin such as an alcohol or an ether;
(iii) optionally, an activator such as a thermal acid generator, a photo acid generator, an amine crosslinker; and
(III) curing the coating composition to produce a cured silicon coating on top of the first patterned material covering the entire pattern
(IV) partially removing the cured silicon coating to expose the top surface of the first patterned material;
(V) removing the first patterned material thereby forming a second patterned in the cured silicon coating; and
(VI) optionally, further transferring the second pattern onto any underlayer.

The coating composition typically contains a solvent. The solvent should be one that does not dissolve the patterned coating. Useful solvents include, but are not limited to, 1-methoxy-2-propanol, 4-methyl-2-pentanol, propylene glycol monomethyl ethyl acetate, γ-butyrolactone, and cyclohexanone, among others. The coating composition typically comprises from 10% to 99.9 wt % solvent based on the total weight of the coating composition, alternatively 80 to 98 wt %.

The coating composition is applied on a substrate having a pattern thereon. Typically the substrate is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

The pattern on the semiconductor device is typically a photoresist layer that has been applied and patterned. Typically the patterned photoresist is formed over an antireflective coating which is formed over a hardmask as seen in FIG. 1. Methods for applying the photoresist, antireflective coating and hardmask layers are known in the art. Methods for producing a pattern in the photoresist layer are also known in the art.

The coating composition optionally comprises an activator, selected from thermal acid generator, a photo acid generator, an amine crosslinker. Typically the activator is present in the coating composition in an amount of up to 20,000 ppm, alternatively 10 to 10,000 ppm, based on the total weight of the coating composition.

A thermal acid generator is a compound which is capable of generating an acidic moiety when heated, e.g., during the baking step or the resist flow process. Thermal acid generators can be nonionic thermal acid generator, ionic acid generator or polymeric acid generators. Exemplary nonionic thermal acid generators include but no limit to cyclotioxyl p-toluenesultonate, menthyl p-toluenesulfonate and cyclohexyl 2,4,6-triisopropylbenzene sulfonate, nitrobenzyl esters, benzoin tosylate, 2-nitrobenzyl tosylate, tris(2,3-dibromopropyl)-1,3,5-triazine-2,4,6-trione, the alkyl esters of organic sulfonic acids, p-toluenesulfonic acid, dodecylbenzenesulfonic acid, oxalic acid, phthalic acid, phosphoric acid, camphorsulfonic acid, 2,4,6-trimethylbenzene sulfonic acid, triisopropylnaphthalene sulfonic acid, 5-nitro-o-toluene sulfonic acid, 5-sulfosalicylic acid, 2,5-dimethylbenzene sulfonic acid, 2-nitrobenzene sulfonic acid, 3-chlorobenzene sulfonic acid, 3-bromobenzene sulfonic acid, 2-fluorocaprylnaphthalene sulfonic acid, dodecylbenzene sulfonic acid, 1-naphthol-5-sulfonic acid, 2-methoxy-4-hydroxy-5-benzoyl-benzene sulfonic acid, and their salts, and mixtures thereof. Ionic thermal acid generators include but not limit to dodecylbenzenesulfonic acid triethylamine salt, dodecylbenzenedisulfonic acid triethylamine salt, sulfonate salts, such as carbocyclic aryl (e.g. phenyl, napthyl, anthracenyl, etc.), heteroaryl (e.g. thienyl) or aliphatic sulfonate salts, preferably carbocyclic aryl sulfonate salts, optionally substituted benzenesulfonate salts, etc. The carbocyclic aryl sulfonate salts can be unsubstituted or substituted by, for example, one or more of hydroxy; optionally substituted alkyl; optionally substituted alkenyl; optionally substituted alkoxy; optionally substituted carbocyclic aryl e.g. optionally substituted phenyl, optionally substituted naphthyl, optionally substituted anthracene and the like; optionally substituted aralkyl such as aralkyl e.g. optionally substituted benzyl and the like; and optionally substituted heteroaromatic or heteroalicyclic groups preferably having 1 to 3 rings, 3 to 8 ring members in each ring and from 1 to 3 heteroatoms such as coumarinyl, quinolinyl, pyridyl, pyrazinyl, pyrimidyl, furyl, pyrrolyl, thienyl, thiazolyl, oxazolyl, imidazolyl, indolyl, benzofuranyl, benzothiazol, tetrahydrofuranyl, tetrahydropyranyl, piperdinyl, morpholino, pyrrolindinyl; and others.

A photo acid generator is a compound which is capable of generating an acidic moiety when exposed to UV, e.g., during the baking step or the resist flow process. Photo acid generators include sulfide and onium type compounds. Photo acid generators include, but are not limited to diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

An amine crosslinker is a compound which is capable of generating amine when heated or exposed to UV, e.g., during the baking step or the resist flow process. Exemplary amine crosslinkers include but not limited to glycoluril-formaldehyde resins, melamine-formaldehyde resins, benzoguanamine-formaldehyde resins, and urea-formaldehyde resins, N,N,N,N-tetra(alkoxymethyl)glycoluril, N,N,N,N-tetra(alkoxymethyl)glycoluril, N,N,N,N-tetra(methoxymethyl) glycoluril, N,N,N,N-tetra(ethoxymethyl)glycoluril, N,N,N,N-tetra(n-propoxymethyl)glycoluril, N,N,N,N-tetra(t-propoxymethyl)glycoluril, N,N,N,N-tetra(n-butoxymethyl) glycoluril and N,N,N,N-tetra(t-butoxymethyl)glycoluril. N,N,N,N-tetra(methoxymethyl)glycoluril is available under the trademark POWDERLINK from Cytec Industries (e.g., POWDERLINK 1174).

Specific methods for application of the coating composition to the substrate include, but are not limited to, spin-coating, dip-coating, spay-coating, flow-coating, screen-printing and others. The typical method for application is spin coating. Typically, coating involves spinning the electronic device, at 1,000 to 2,000 RPM, and adding the coating composition to the surface of the spinning electronic device.

Once the coating composition has been applied, any solvent is removed and the coating composition exposed to a curing mechanism to activate the activator in the reverse patterning coating layer and cause the coating composition to cure. Depending on the functional group on the silsesquioxane resin and the activator in the composition the curing mechanism may be by thermal or radiation.

To thermally cure the coating composition, the coated substrate is heated to a sufficient temperature for a sufficient duration to lead to curing. Curing may take place for example by heating the coated electronic device at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates.

Radiation curing occurs when the coating composition is exposed to a radiation source such as UV, X-ray, e-beam, EUV, or the like. Typically ultraviolet radiation having a wavelength of 193 nm to 365 nm is used, alternatively ultraviolet radiation having a wavelength of 246 nm or 365 nm is used. Suitable radiation sources include mercury, mercury/xenon, and xenon lamps. At longer wavelength radiation is used, e.g., 365 nm, it is suggested to add a sensitizer to the coating composition to enhance absorption of the radiation. Full exposure of the coating composition is typically achieved with less than 100 mJ/cm$^2$ of radiation, alternatively with less than 50 mJ/cm$^2$ of radiation.

The amount of coating composition that cures will depend upon the amount of activator in the photo-resist and the time that the coating composition is exposed to the curing mechanism. When the coating composition is exposed to a radiation source, it may be desirable to carry out a subsequent thermal treatment to promote the cure in the resin.

In order to transfer the reverse pattern of the first patterned material, typically a photoresist, into the cured silicon coating, one wet etching technique followed by a dry etching techniques is employed. The wet etch step is to use an aqueous base recipe to wet "etch back" the cured silicon coating to the top of the first patterned material, exposing the entire top surface of the first patterned material. Alternately, a reactive ion etch recipe containing CF4 to dry "etch back" the cured silicon coating to the top of the first patterned material, exposing the entire top surface of the first patterned material.

The second step is to use a second reactive ion etch recipe containing $O_2$ to etch away the first patterned material. The result is a cured silicon coating with via holes the size and shape of the first patterned material. The cured silicon coating can be used to further transfer the via hole pattern onto another critical layer.

Additional steps or transferring the pattern into the underlying layers may be employed to produce a device having the desired architecture.

EXAMPLES

The following examples are included to demonstrate embodiments of the invention. It should be appreciated by those of skill in the art that the techniques disclosed in the examples which follow represent techniques discovered by the inventor to function well in the practice of the invention, and thus can be considered to constitute typical modes for its practice. However, those of skill in the art should, in light of the present disclosure, appreciate that many changes can be made in the specific embodiments which are disclosed and still obtain a like or similar result without departing from the invention. All percentages are in wt. %. In the following examples Me represents methyl, Ph represents phenyl, CH represents cyclohexyl, and n-Pr represents n-propyl.

Example 1

$$T^{Me}_{0.80}T^{R}_{0.20},$$

R is

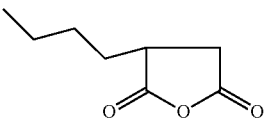

and/or its derivative with an open structure 90 g of toluene, 54.49 g of methyltrimethoxysilane (0.40 mol), 49.6 g of triethoxypropyl succinic anhydride (0.10 mol), 294 g of methanol, 71 g of water, 1 g of 0.1 N nitric acid were added to a 500 mL flask equipped with a nitrogen inlet and outlet, a mechanical stirshaft, a Dean-Stark trap, a condenser. The mixture was stirred for 1 hour at room temperature and then refluxed for 4 hours. After about 200 g of solvent was removed from the Dean-Stark trap, the temperature was raised to 72° C. 75 g of toluene was added to the reactor and the temperature. The process of removal of 75 g of solvent and addition of same amount of solvent was repeated 3 times until the temperature reached to 100° C. The reaction was stopped. The resin solution was solvent exchanged to 4-methyl-2-pentaol at 40 ° C. with a concentration of 10 wt %.

Example 2

$$T^{Me}_{0.45}T^{R}_{0.05}Q_{0.50}$$

R is

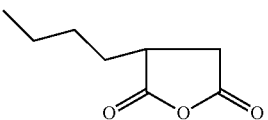

and/or its derivative with an open structure 100 g of methylisobutylketone, 40.12 g of methyltriethoxysilane (0.225 mol), 7.61 g of triethoxypropyl succinic anhydride (0.025 mol), 52.08 g of tetraethoxysilane (0.25 mol), 80 g of ethanol, 55 g of water, 2 g of 0.1 N nitric acid were added to a 500 mL flask equipped with a nitrogen inlet and outlet, a mechanical stirshaft, a Dean-Stark trap, a condenser. The mixture was stirred for 1 hour at room temperature and then refluxed for 4 hours. After about 200 g of solvent was removed from the Dean-Stark trap, the temperature was raised to 81° C. 75 g of toluene was added to the reactor and the temperature. The process of removal of 75 g of solvent and addition of same amount of solvent was repeated 3 times until the temperature reached to 115° C. The reaction was stopped. The resin solution was solvent exchanged to 4-methyl-2-pentaol at 40° C. with a concentration of 10 wt %.

Example 3

$$T^{Me}_{0.20}T^{R}_{0.05}Q_{0.75}$$

R is

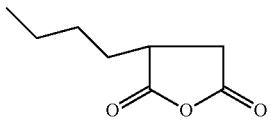

and/or its derivative with an open structure 80 g of methylisobutylketone, 17.83 g of methyltriethoxysilane (0.10 mol), 7.61 g of triethoxypropyl succinic anhydride (0.025 mol), 78.12 g of tetraethoxysilane (0.375 mol), 100 g of ethanol, 45 g of water, 2 g of 0.1 N nitric acid were added to a 500 mL flask equipped with a nitrogen inlet and outlet, a mechanical stirshaft, a Dean-Stark trap, a condenser. The mixture was stirred for 1 hour at room temperature and then refluxed for 4 hours. After about 200 g of solvent was removed from the Dean-Stark trap, the temperature was raised to 81° C. Subsequently, 75 g of toluene was added to the reactor and the temperature. The process of removal of 75 g of solvent and addition of same amount of solvent was repeated 3 times until the temperature reached to 115° C. The reaction was stopped. The resin solution was solvent exchanged to 4-methyl-2-pentaol at 40° C. with a concentration of 10 wt %.

Example 4

$$T^{Me}_{0.80}T^{R}_{0.05}T^{Ph}_{0.15}$$

R is

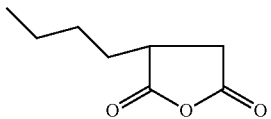

and/or its derivative with an open structure 150 g of methylisobutylketone, 54.49 g of methyltriethoxysilane (0.40 mol), 14.9 g of phenyltrimethoxysilane (0.075 mol), 7.61 g of triethoxypropyl succinic anhydride (0.025 mol), 30 g of ethanol, 36 g of water, 1 g of 0.1 N nitric acid were added to a 500 mL flask equipped with a nitrogen inlet and outlet, a mechanical stirshaft, a Dean-Stark trap, a condenser. The mixture was stirred for 1 hour at room temperature and then refluxed for 4 hours. After about 200 g of solvent was removed from a Dean-Stark trap, the temperature was raised to 120° C. The solution was refluxed for 2 hours while water was collected through the Dean-Strak trap. The resin was solvent exchanged to 4-methyl-2-pentanol to obtain a 10% resin solution by weight.

Example 5

$$T^{Me}_{0.80}T^{R}_{0.05}T^{CH}_{0.15}$$

R is

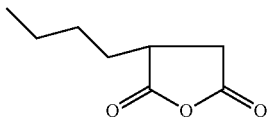

and/or its derivative with an open structure and CH is cyclohexyl 300 g of methylisobutylketone, 109.0 g of methyltrimethoxysilane (0.80 mol), 30.65 g of cyclohexyltrimethoxysilane (0.15 mol), 15.22 g of triethoxypropyl succinic anhydride (0.05 mol), 72 g of water, 2 g of 0.1 N nitric acid were added to a 1 L flask equipped with a nitrogen inlet and outlet, a mechanic stirshaft, a Dean-Stark trap, a condenser. The mixture was stirred for 1 hour at room temperature and then refluxed for 4 hours. After about 370 g of solvent was removed from a Dean-Stark trap, the temperature was raised to 125° C. The solution was refluxed for 2 hours while water was collected through the Dean-Stark trap. The resin was solvent exchanged to 4-methyl-2-pentanol to obtain a 10% resin solution by weight.

Example 6

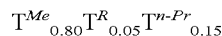

R is

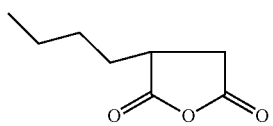

and/or its derivative with an open structure and n-Pr is n-propyl 300 g of methylisobutylketone, 109.0 g of methyltrimethoxysilane (0.80 mol), 24.64 g of n-propyltrimethoxysilane (0.15 mol), 15.22 g of triethoxypropyl succinic anhydride (0.05 mol), 72 g of water, 2 g of 0.1 N nitric acid were added to a 1 L flask equipped with a nitrogen inlet and outlet, a mechanic stirshaft, a Dean-Stark trap, a condenser. The mixture was stirred for 1 hour at room temperature and then refluxed for 4 hours. After about 370 g of solvent was removed from a Dean-Stark trap, the temperature was raised to 125° C. The solution was refluxed for 2 hours while water was collected through the Dean-Stark trap. The resin was solvent exchanged to 4-methyl-2-pentanol to obtain a 10% resin solution by weight.

Example 7

Formulation for Spin-coating and Thermal Cure

About 2 g of 10 wt % above resin solution was used for each coating. Film coating on wafers was processed on a Karl Suss CT62 spin coater. The film thicknesses were measured using a J. A. Woollam ellipsometer. The formulated resin solution was first filtered through a 0.20 μm PTFE membrane filter and then spin coated onto standard single side four inch polished low resistively wafers or double sided polished FTIR wafers (spin speed 2000-4000 rpm). Films were prebaked and cured at 120° C. or 150° C. for 2 minutes.

Example 8

Solvent Resistance and TMAH Solubility of the Thin Films Cured at 150° C.

| | | | Thermal Cure | | Thermal Cure | |
|---|---|---|---|---|---|---|
| Material | $M_w$ vs. PS | $M_w/M_n$ vs. PS | Thin Film Thickness After Cured (Å) | Thickness Change in PGMEA (Å) | Thin Film Thickness After Cured (Å) | Thickness Change in TMAH (Å) |
| $T^{Me}_{0.80}T^R_{0.20}$ | 9280 | 3.99 | 2526 | 47 | 2529 | 2506 |
| $T^{Me}_{0.45}T^R_{0.05}Q_{0.50}$ | 4460 | 2.25 | 3282 | 20 | 3291 | 3278 |
| $T^{Me}_{0.20}T^R_{0.05}Q_{0.75}$ | 4970 | 2.54 | 2510 | 24 | 2503 | 2490 |
| $T^{Me}_{0.80}T^R_{0.05}T^{Ph}_{0.15}$ | 3460 | 2.31 | 2687 | 298 | 2684 | 2004 |

Example 9

Effect of Cure Temperature on the Solvent Resistance and TMAH Solubility of the Thin Films

| | | | | Thermal Cure | | | Thermal Cure | |
|---|---|---|---|---|---|---|---|---|
| Material | $M_w$ vs. PS | $M_w/M_n$ vs. PS | Cure Temperature (° C.) | Thin Film Thickness After Cured (Å) | Thickness Change in PGMEA (Å) | Cure Temperature (° C.) | Thin Film Thickness After Cured (Å) | Thickness Change in TMAH (Å) |
| $T^{Me}_{0.80}T^R_{0.05}T^{CH}_{0.15}$ | 11500 | 4.99 | 120 | 2679 | 2627 | 120 | 2685 | 1164 |
| | | | 150 | 2548 | 340 | 150 | 2540 | −265 |
| $T^{Me}_{0.80}T^R_{0.05}T^{n-Pr}_{0.15}$ | 3600 | 2.30 | 120 | 2578 | 2543 | 120 | 2570 | 2545 |
| | | | 150 | 2400 | 346 | 150 | 2395 | 2339 |

The invention claimed is:

1. A silsesquioxane resin comprised of the units

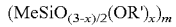

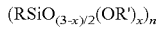

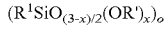

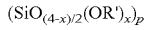

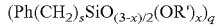

where Ph is a phenyl group, Me is a methyl group; R' is hydrogen atom or a hydrocarbon group having from 1 to 4 carbon atoms; R is an anhydride containing group, and $R^1$ is a hydrophilic group or a hydrophobic group; and s has a value of 0, 1, 2, 3, or 4; x has a value of 0, 1 or 2; wherein in the resin m has a value of 0.1 to 0.95, n has a value of 0.020 to 0.5; o has a value of 0 to 0.5; p has a value of 0 to 0.95; q has a value of 0 to 0.5 and m+n+o+p+q=1.

2. The silsesquioxane resin as claimed in claim 1 where m has a value 0.2 to 0.85, n has a value of 0.02 to 0.2, o has a value of 0 to 0.15, p has a value of 0 to 0.75, q has a value of 0 to 0.15.

3. The silsesquioxane resin as claimed in claim 1 wherein $R^1$ is selected from substituted phenyl groups, ester groups, polyether groups, mercapto groups, aliphatic groups, cycloaliphatic groups, and fluorine containing alkyl groups.

4. The silsesquioxane resin as claimed in claim 1 wherein R is a 3-succinic anhydride propyl group.

5. A method for forming a reverse pattern on a substrate wherein the method comprises
    (I) applying a coating composition over a first patterned material wherein the coating composition comprises
    (i) a silsesquioxane resin comprised of the units

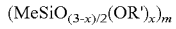

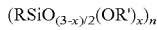

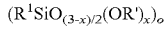

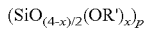

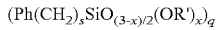

where Ph is a phenyl group, Me is a methyl group; R' is hydrogen atom or a hydrocarbon group having from 1 to 4 carbon atoms; R is an anhydride containing group, and $R^1$ is a hydrophilic group or a hydrophobic group; and s has a value of 0, 1, 2, 3, or 4; x has a value of 0, 1 or 2; wherein in the resin m has a value of 0.1 to 0.95, n has a value of 0.020 to 0.5; o has a value of 0 to 0.5; p has a value of 0 to 0.95; q has a value of 0 to 0.5 and m+n+o+p+q=1; and
    (ii) a solvent; and
    (iii) optionally, an activator
    (III) curing the coating composition to produce a cured silicon coating on top of the first patterned material covering the entire pattern
    (IV) partially removing the cured silicon coating to expose the top surface of the first patterned material;
    (V) removing the first patterned material thereby forming a second patterned in the cured silicon coating; and
    (VI) optionally, further transferring the second pattern onto any underlayer.

6. The method as claimed in claim 5 where m has a value 0.2 to 0.85, n has a value of 0.02 to 0.2, o has a value of 0 to 0.15, p has a value of 0 to 0.75, q has a value of 0 to 0.20.

7. The method as claimed in claim 5 wherein $R^1$ is selected from substituted phenyl groups, ester groups, polyether groups, mercapto groups, aliphatic groups, cycloaliphatic groups, and fluorine containing groups.

8. The method as claimed in claim 5 wherein R is a 3-succinic anhydride propyl group.

9. The method as claimed in claim 5 wherein the solvent is selected from 1-methoxy-2-propanol, 4-methyl-2-pentanol, propylene glycol monomethyl ethyl acetate, γ-butyrolactone, and cyclohexanone.

10. The method as claimed in claim 5 wherein the activator is selected from a thermal acid generator, a photacid generator, or an amine.

11. The method as claimed in claim 5 wherein the coating composition is thermally cured by heating at 80° C. to 450° C. for 0.1 to 60 minutes.

12. The method as claimed in claim 5 wherein the coating composition is radiation cured by exposing the coating composition to a radiation source selected from UV, X-ray, e-beam, or EUV.

13. The method as claimed in claim 5 wherein the cured silicon coating composition is partially removed using an aqueous base stripper.

14. The method as claimed in claim 5 wherein the first patterned material is removed by a reactive ion etch containing $O_2$.

* * * * *